United States Patent [19] [11] Patent Number: 4,788,592
Yamawaki et al. [45] Date of Patent: Nov. 29, 1988

[54] CSD TYPE SOLID-STATE IMAGING DEVICE WITH MEANS FOR DRAINING EXCESS CHARGES

[75] Inventors: Masao Yamawaki, Itami; Takashi Ito, Nagaokakyo, both of Japan

[73] Assignee: Mitsubishi Denki Kabushiki Kaisha, Japan

[21] Appl. No.: 130,203

[22] Filed: Dec. 8, 1987.

[30] Foreign Application Priority Data

Dec. 15, 1986 [JP] Japan ............................. 61-298492

[51] Int. Cl.[4] ............................................. H04N 3/14
[52] U.S. Cl. .......................... 358/213.29; 358/213.15; 358/213.26
[58] Field of Search ..................... 358/213.19, 213.26, 358/213.29, 231.15, 909; 357/241 R

[56] References Cited

U.S. PATENT DOCUMENTS 4,489,423  12/1984  Suzuki ........................ 357/24 LR
4,652,925   3/1987  Kimata ....................... 358/213.19
4,686,573   8/1987  Murayama et al. ........... 358/213.29
4,707,744  11/1987  Kimata et al. ............... 358/213.26

OTHER PUBLICATIONS

"A 480×400 Element Image Sensor with a Charge Sweep Device", IEEE ISSCC, Digest of Technical Papers pp. 100 to 101, 1985.

Primary Examiner—Jin F. Ng
Assistant Examiner—Stephen Brinich
Attorney, Agent, or Firm—Leydig, Voit & Mayer

[57] ABSTRACT

A CSD type solid-state imaging device having horizontal transfer means for transferring charges stored at the storage electrodes in the horizontal direction and gates for selecting elements having excess charges and drains for draining the excess charges, both provided at the vertical transfer means at the neighbourhood of the storage electrode. The charges of a plurality of light-electricity conversion elements provided spaced apart from each other by a distance of more than two picture elements in the vertical direction are read out to the vertical transfer means within a same horizontal blanking period and signal charges corresponding to at least more than one picture element are drained to the drain through the gate while transferring the charges in the vertical direction.

4 Claims, 7 Drawing Sheets

F I G .1.
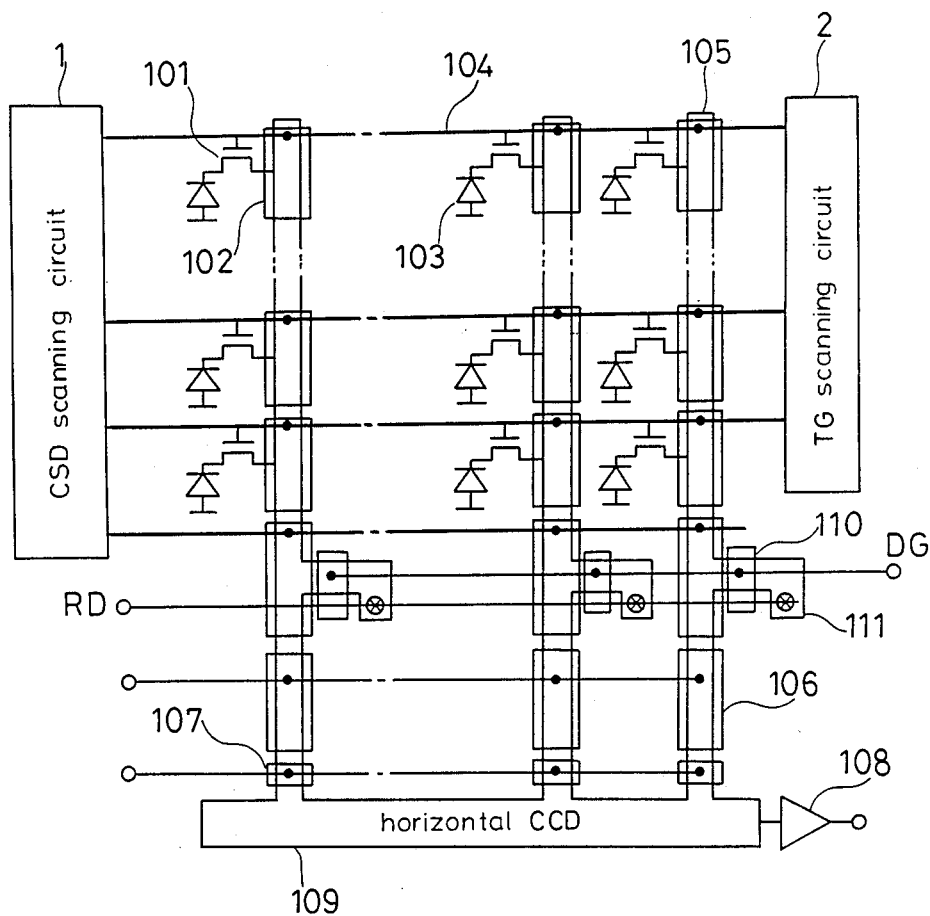

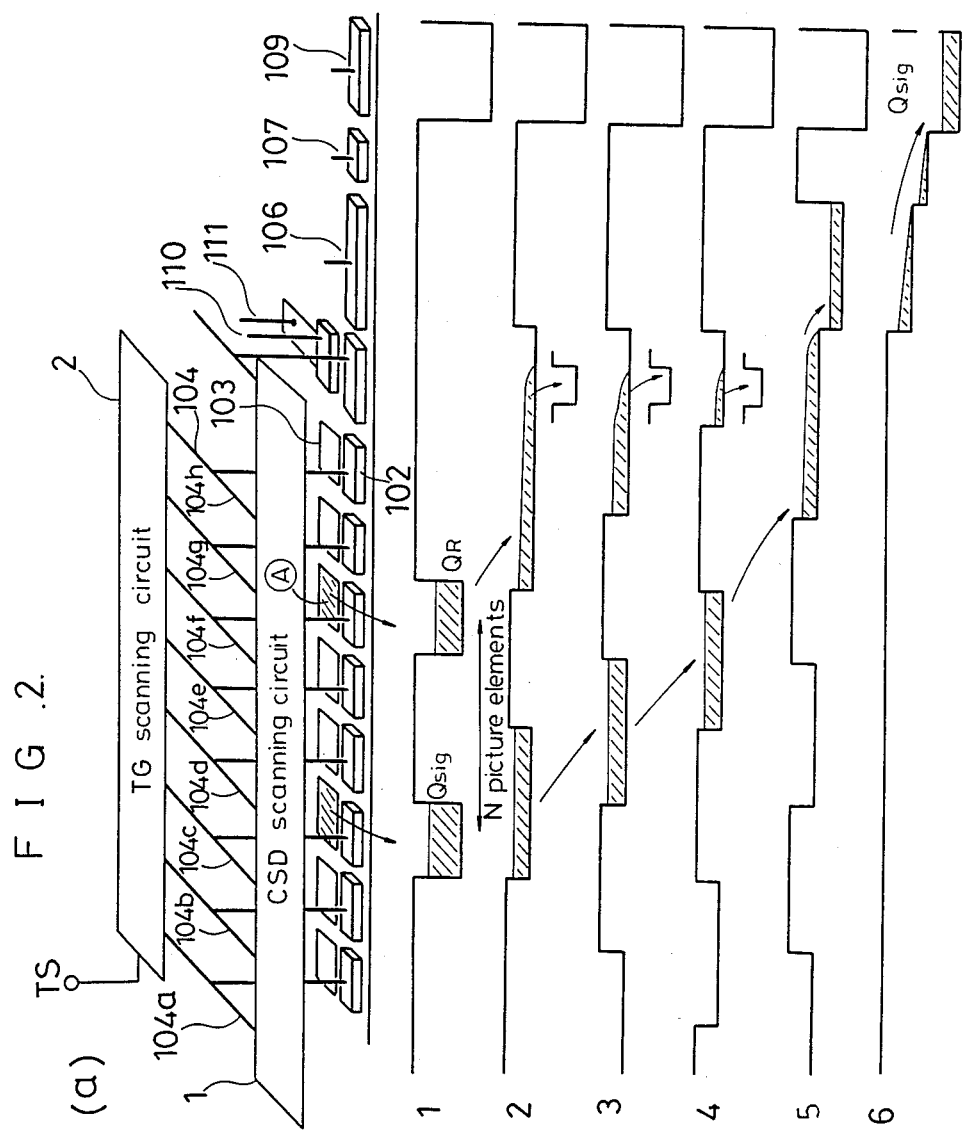

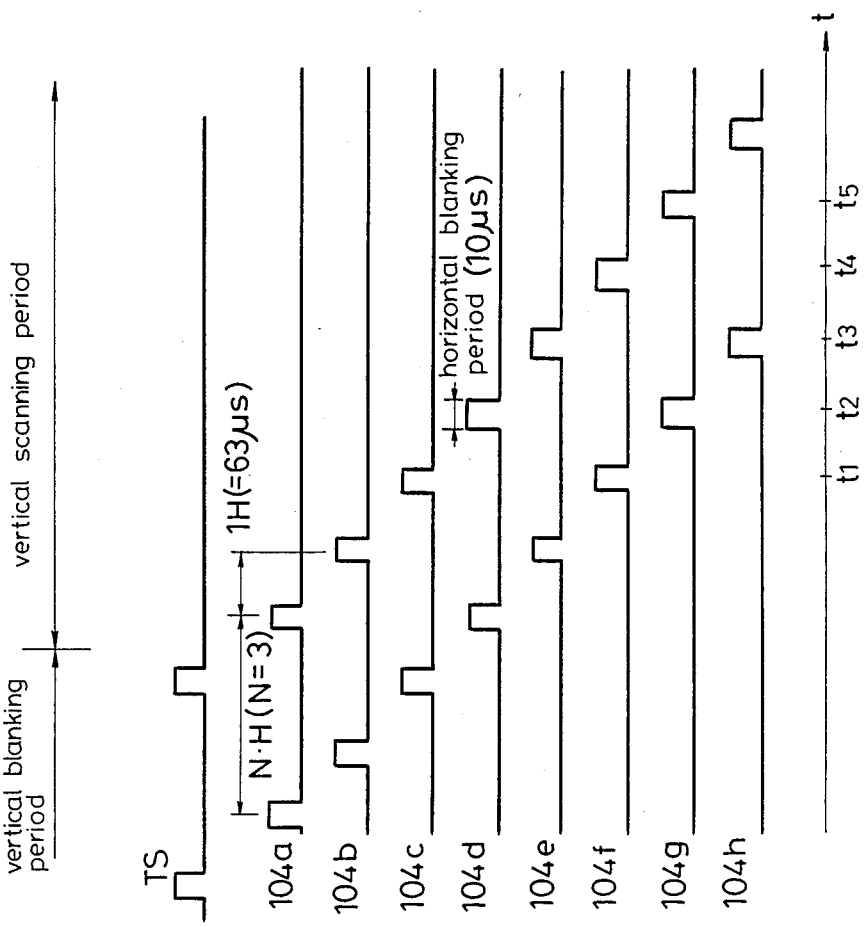

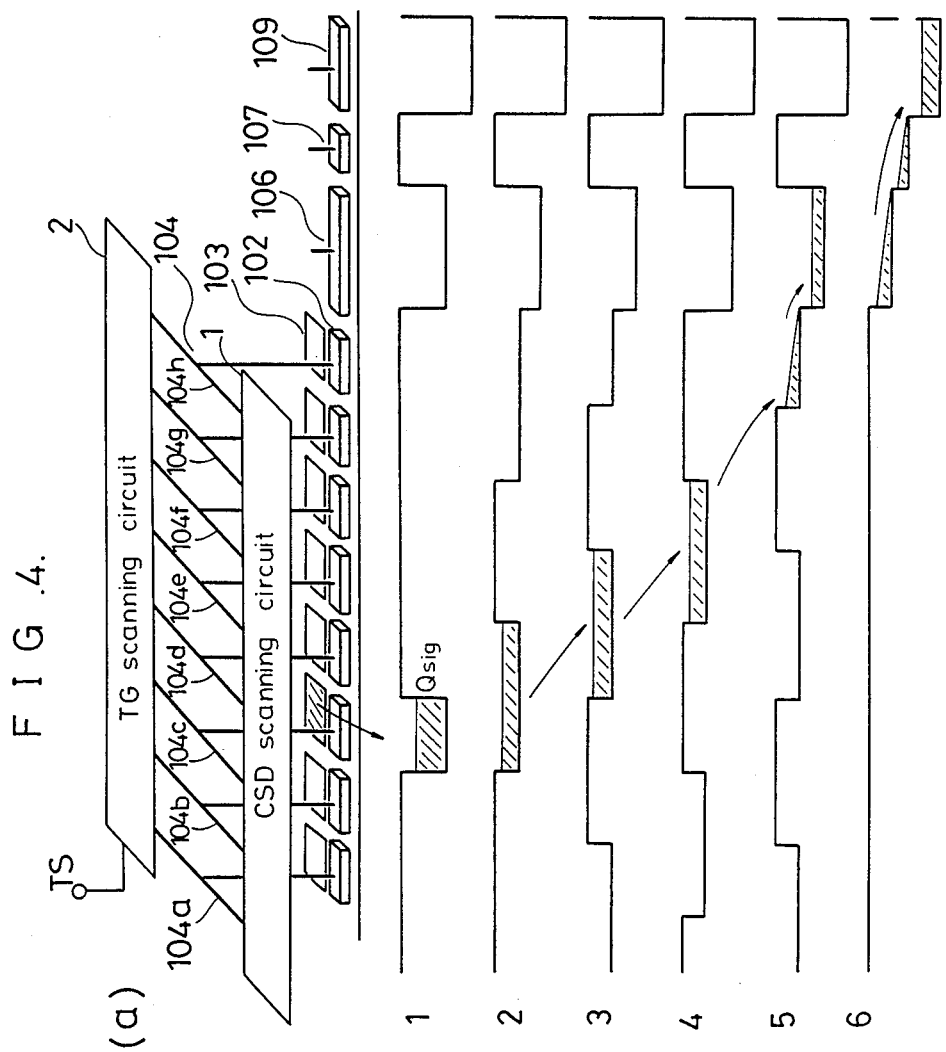

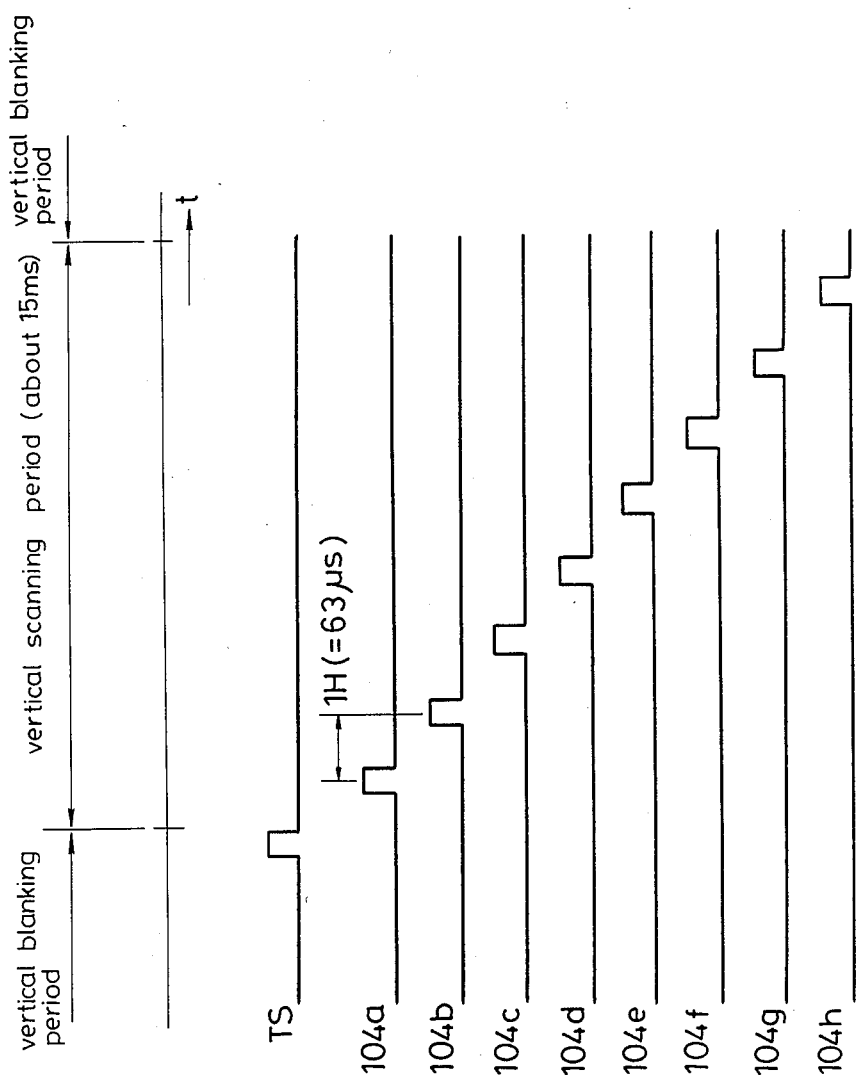

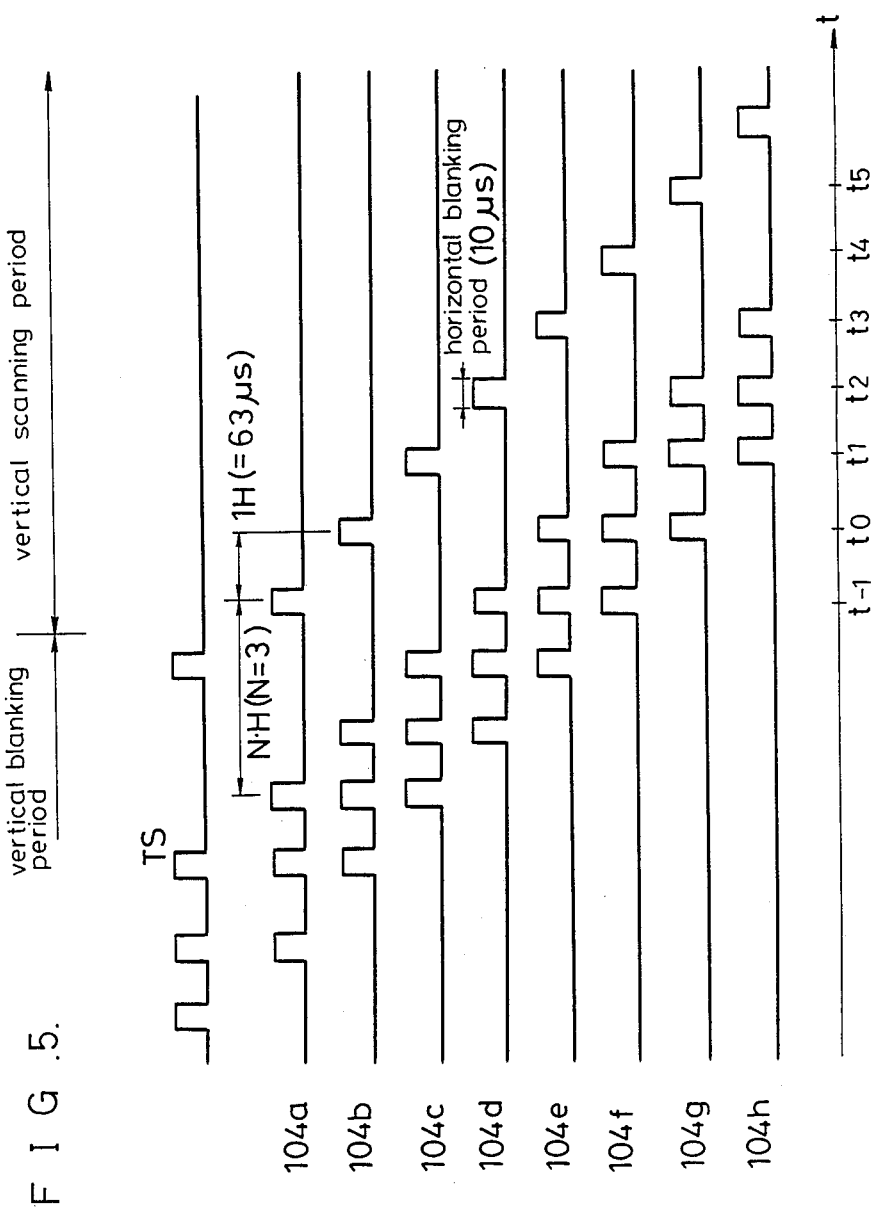

CSD TYPE SOLID-STATE IMAGING DEVICE WITH MEANS FOR DRAINING EXCESS CHARGES

FIELD OF THE INVENTION

The present invention relates to a CSD type solid-state imaging device and more particularly to an improvement in the electronic shutter operation thereof.

BACKGROUND ART

The recent development in the enhancement of integration density in the CSD type solid-state imaging device is eminent. The area occupied by an element is fine patterned, and with the progress of the fine patterning an enhancement in the sensitivity is required. As one satisfying such a requirement of high sensitivity, a charge sweeping type solid-state imaging device (hereinafter referred to as a "CSD imaging device") is disclosed in M. Kimata et al, "International Solid State Circuit Conference, Digest of Technical Papers" 1985 February, pp 100, in which the utility thereof is also confirmed.

FIG. 3 shows a block diagram of a CSD type imaging device, and FIG. 4(a) shows the operation concept thereof. That is, the cross section of the CSD element in the vertical direction and the potential distribution thereof are typically illustrated.

In FIG. 3, the reference numeral 103 designates a light-electricity conversion element such as a photodiode, the numeral 101 designates a transfer gate for reading out the charges from the photodiode 103, the numeral 105 designates a CSD channel, and the numeral 102 designates a CSD transfer electrode. The transfer gate 101 and the CSD transfer electrode 102 are usually constituted by the same electrode. The numeral 104 designates a vertical scanning line and all the CSD transfer electrodes 102 are combined by the vertical scanning line 104 in the horizontal direction. The numeral 106 designates a storage gate (ST), the numeral 107 designates a storage control gate, the numeral 108 designates an output section, and the numeral 109 designates a horizontal CCD.

The operation of this CSD type imaging device will be described with reference to FIG. 4.

At first, when a transfer gate is selected by the TG scanning circuit 2 during the horizontal blanking period, signal charges (Qsig) are read out to the CSD channel 105. In this figure, the vertical scanning line 104c is selected and the charges Qsig are read out from the hatched photodiode 103 (refer to 1 of FIG. 4(a)). Next, the signal charges Qsig are transferred by CSD in the horizontal reading out period (refer to 2 to 4 of FIG. 4(a)). Then, the CSD operates similarly as a four phase CCD, driven by the CSD scanning circuit 1. The signal charges Qsig are collected at the storage gate 106 by such an operation, and transferred to the horizontal CCD 109 through the storage control gate 107 in the next horizontal blanking period (refer to 6 of FIG. 4(a)). FIG. 4(b) typically shows the timing chart of the picture element selection signals applied to the vertical scanning line 104a to 104h by the TG scanning circuit 2. The respective vertical scanning line 104 is selected only one time in one field.

By the way, an electronic shutter function of 1/1000 second, that is, a function of viewing the imaged picture with stopping the same at about 1/1000 second is required in image sensors recently. In the prior art solid-state imaging device, however, it takes 1/60 second to read out one frame of a picture. The light which is input during that time period is integrated as the output signal. An example which has realized the above-described electronic shutter function is an interline type CCD (ILCCD) sensor. In this ILCCD the light detector is for a while and the light signal of only about 1 ms duration is stored at the light detector during the vertical blanking period of about 1 ms. Thereafter this stored signal is read out to the vertical CCD, thereby realizing an exposure time of 1/1000 second.

In this way, in an ILCCD a shutter operation can be easily realized because the vertical CCD operation is equivalent to those of memory elements corresponding to one picture frame. Furthermore, the excess charges stored in a time period other than the shutter period can be swept out during the vertical blanking period for storing the signal charges by the use of the vertical CCD independently of the operation of the photodiode.

On the other hand, in the above-described CSD type imaging device, picture element selections are conducted successively during the vertical scanning period, and this leads to a difficulty in charges while keeping the exposure time constant.

SUMMARY OF THE INVENTION

An object of the present invention is to provide an improved CSD type solid-state imaging device capable of draining excess charges.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a CSD type solid-state imaging device comprising: light-electricity conversion elements arranged in a two dimensional array; a scanning circuit for selecting the light-electricity conversion elements; vertical transfer means for transferring charges of the selected light-electricity conversion elements in the vertical direction; storage electrodes for temporarily storing the charges transferred in the vertical direction; horizontal transfer means for transferring charges stored at the storage electrodes in the horizontal direction; gates for selecting elements having unrequired charges and drains for sweeping out draining excess charges, both provided at the vertical transfer means at the neighbourhood of the storage electrode; the charges of a plurality of light-electricity conversion elements spaced apart from each other by a distance of more than two picture elements in the vertical direction being intended to be read out to the vertical transfer means within a same horizontal blanking period; and signal charges corresponding to at least more than one picture element being intended to be swept out to the drain through the gate while transferring the charges in the vertical direction.

BRIEF DESCRIPTION OF THE DRAWINGS

FIG. 1 is a block diagram showing a CSD type solid-state imaging device as an embodiment of the present invention;

FIGS. 2(a) and (b) are diagrams for exemplifying the operation of the above embodiment;

FIGS. 4(a) and (b) are diagrams for exemplifying the operation of the device of FIG. 3; and FIG. 5 is a timing chart for exemplifying the operation of another embodiment.

DETAILED DESCRIPTION OF THE PREFERRED EMBODIMENTS

Figure 3:
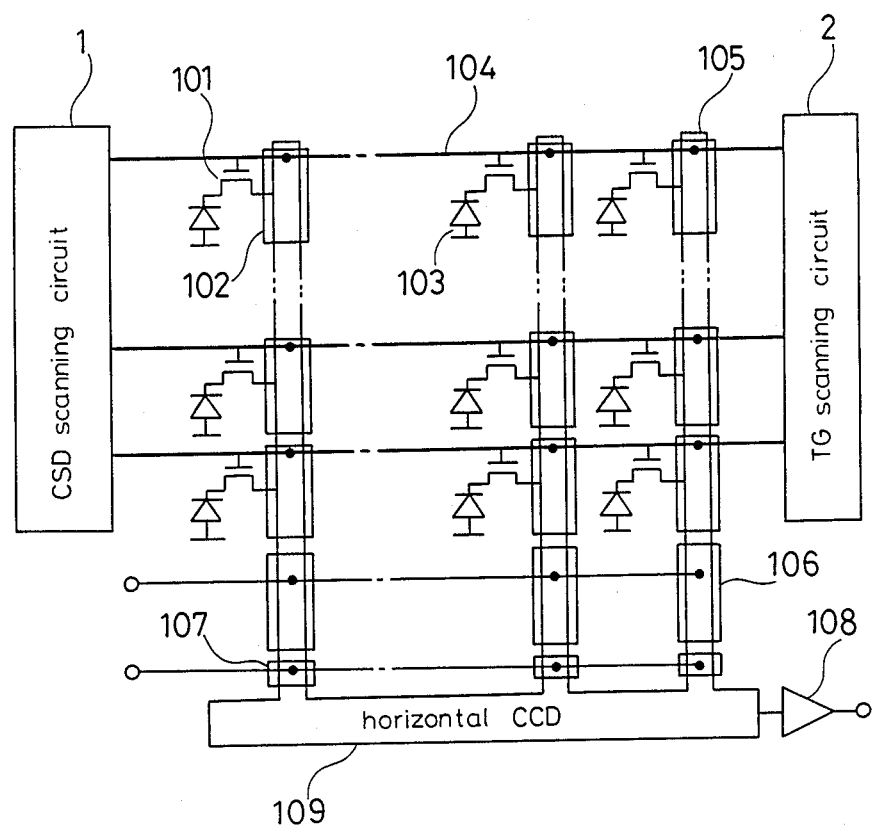
FIG. 3 is a block diagram showing a prior art CSD type solid-state imaging device.

In order to explain the present invention in detail, reference will be particularly made to FIG. 1.

FIG. 1 shows a CSD type solid-state imaging device as an embodiment of the present invention.

In FIG. 1, the reference numeral 110 designates a drain gate (DG) for selecting elements having excess charges. The reference numeral 111 designates a reset drain (RD) for draining the excess charges.

The operation of the device will be described with reference to FIG. 2.

FIG. 2(a) typically shows the cross section of the CSD elements in the vertical direction and the potential distribution thereof, and FIG. 2(b) shows the timing chart of the picture element selection signal applied to the vertical scanning line.

At first, at time $t_1$ two picture elements selected by the vertical scanning lines 104c and 104f which are separated by a distance of N picture elements are simultaneously selected, and respective signal charges Qsig and QR are read out to the CSD channel 105 from the respective picture elements (refer to 1 of FIG. 2(a)). Herein, QR designates excess charges and Qsig designates signal charges stored during a predetermined time period (corresponding to a shutter period of N·H period) as apparent from the later description. Thereafter, these charges Qsig and QR are transferred through the same CSD channel at the same time, and only the excess charges QR are read out from the reset drain terminal RD through the drain gate terminal 110 (refer to 2 to 4 of FIG. 2(a)). Thereafter, signal charges Qsig are transferred toward the drain gate DG, but at the timing when the draining of the charges QR is concluded the drain gate terminal DG is switched to "L" level from "H" level, and the storage gate ST 106 is switched to "H" level from "L" level, and thus the CSD channel is driven so that only the signal charges Qsig may be transferred to the storage gate 106 (refer to 5 of FIG. 2(a)). Then, the switching timing of the drain gate terminal DG and the storage gate terminal ST can be easily established by a counter or a shift register with the use of external clocks corresponding to the vertical picture element selection address.

Next, at time $t_2$ the picture elements selected by the vertical scanning lines 104d and 104g are read out, and this operation is repeated successively. That is, the photodiode A which has once read out the charges is reset at time $t_1$, and stores charges until it is read out next. Thereafter, the photodiode A is again selected at time $t_4$, and the charges read out becomes an output signal. Accordingly, the photodiode A outputs only the signals stored during the period of N·H (H is a horizontal period of 63 μs and N=3), and this means that an operation of an electronic shutter is achieved. The N can be set by an external circuit, and in FIG. 2(a) the operation of the TG scanning circuit 2 constituted by a shift register is controlled with the use of the TS clocks (synchronous pulses of the TG scanning circuit 2). By making the N variable it is possible to conduct a shutter operation of a desired time length with 63 μs as a unit.

In the above-illustrated embodiment one time picture element selection is conducted so as to read out excess charges of the photodiode, and there is an anxiety that the excess charges QR amount to a fairly larger amount than the signal charges Qsig, that the interval between the excess charge QR and the signal charges Qsig becomes narrow at a rapid shutter speed, and that the excess charges QR overflow and enter into the signal charges Qsig. Actually when the shutter period is made N.H, the ratio of the signal charges Qsig and the excess charges QR ($R_{sig/R}$) is proportional to the storage time and can be approximated as:

$$R_{sig/R} = Qsig/QR = \frac{N \cdot 63}{16000 - N \cdot 63}$$

In a shutter of about 1/1000 second the N is set to 16, and then the $R_{sig/R}$ becomes approximately equal to 1/15. That is, the excess charges QR are present in an amount of about 15 times the signal charges Qsig and a mixture of the excess charges QR into the signal charges Qsig is expected.

In order to solve this problem, it is thought of lengthening the distance, i.e., time interval, between the excess charges QR and the signal charges Qsig.

FIG. 5 shows a method of another embodiment of the present invention. In this embodiment a plurality of selection signals for resetting the photodiode are used. This FIG. 5 shows a timing chart corresponding to FIG. 2(b). When the signal of the vertical scanning line 104f is present it is found that the photodiode A is reset in three intervals ($t_{-1}$, $t_0$, $t_1$). In this way, by reading out the excess charges in the photodiode in a plurality of intervals, it is possible to reduce the mixture of the unrequired charges into the signal charges.

As is evident from the foregoing description, according to the present invention, a CSD type imaging device is constituted such that the signal charges and the excessive charges are read out to the CSD at the same time from a plurality of light-electricity conversion elements spaced apart from each other by a distance of more than two picture elements in the vertical direction, and that only the excessive charges are lost from the drain. Thus, a shutter function of a CSD solid-state imaging device is easily realized. Furthermore, when the device is constituted such that the excess charges are read out in a plurality of times, the mixture of the unrequired charges into the signal charges can be reduced and an electronic shutter function of high precision is easily obtained.

What is claimed is:

1. A CSD type solid-state imaging device comprising:
   light-electricity conversion elements arranged in a two dimensional array;
   a scanning circuit for selecting said light-electricity conversion elements;
   vertical transfer means for transferring charges of said selected light-electricity conversion elements in the vertical direction;
   storage electrodes for temporarily storing the charges transferred in the vertical direction;
   horizontal transfer means for transferring charges stored at said storage electrodes in the horizontal direction;
   gates for selecting elements having excess charges and drains for draining excess charges, both provided at said vertical transfer means at the neighbourhood of said storage electrode;

the charges of a plurality of said light-electricity conversion elements spaced apart from each other by a distance of more than two picture elements in the vertical direction being read out to said vertical transfer means within a same horizontal blanking period; and signal charges corresponding to at least more than one picture element being swept out to said drain through said gate while transferring the charges in the vertical direction.

2. A CSD type solid-state imaging device as defined in claim 1, wherein the signal charge storage period of said light-electricity conversion element is fixed and shorter than the period required for reading out all the elements.

3. A CSD type solid-state imaging device as defined in claim 1, wherein charges corresponding to at least more than one element are drained to said drain through said gate and are divided a plurality of times.

4. A CSD type solid-state imaging device as defined in claim 2, wherein charges corresponding to at least more than one element are drained to said drain through said gate and are divided a plurality of times.

* * * * *